United States Patent
Jia

(10) Patent No.: US 10,985,335 B2
(45) Date of Patent: Apr. 20, 2021

(54) FLEXIBLE DISPLAY PANEL AND DISPLAY DEVICE

(71) Applicant: Wuhan China Star Optoelectronics Semiconductor Display Technology Co., Ltd., Wuhan (CN)

(72) Inventor: Chengjie Jia, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 53 days.

(21) Appl. No.: 16/611,480

(22) PCT Filed: Aug. 30, 2019

(86) PCT No.: PCT/CN2019/103486
§ 371 (c)(1),
(2) Date: Nov. 7, 2019

(87) PCT Pub. No.: WO2020/215570
PCT Pub. Date: Oct. 29, 2020

(65) Prior Publication Data
US 2020/0343462 A1    Oct. 29, 2020

(30) Foreign Application Priority Data

Apr. 24, 2019  (CN) .......................... 201910331485.5

(51) Int. Cl.
*H01L 51/00* (2006.01)
*H01L 51/52* (2006.01)
*H01L 27/32* (2006.01)

(52) U.S. Cl.
CPC ...... *H01L 51/0097* (2013.01); *H01L 27/3244* (2013.01); *H01L 51/5253* (2013.01); *H01L 2251/50* (2013.01); *H01L 2251/5338* (2013.01)

(58) Field of Classification Search
CPC ............ H01L 51/0097; H01L 51/5253; H01L 27/3244; H01L 2251/50
See application file for complete search history.

(56) References Cited

U.S. PATENT DOCUMENTS 9,826,626 B2    11/2017  Myeong et al.
10,276,761 B2 *  4/2019  Huang .................. H01L 27/156
(Continued)

FOREIGN PATENT DOCUMENTS

CN    206076240    4/2017
CN    107181838    9/2017
(Continued)

*Primary Examiner* — Ida M Soward

(57) ABSTRACT

A flexible display panel is provided, including a display region and a bending region; a support layer; a substrate disposed on the support layer; a barrier layer disposed on a side of the substrate away from the support layer; a thin film transistor layer disposed on a side of the barrier layer away from the substrate; an organic light emitting layer disposed on a side of the thin film transistor layer away from the barrier layer; and an encapsulation layer disposed on the thin film transistor layer and the organic light emitting layer. In addition, in the bending region, the support layer has at least one groove, and an elastic layer is disposed in the groove. The present disclosure solves the problem of poor recovery ability and poor support ability of the bending region of the display panel.

13 Claims, 3 Drawing Sheets

(56) References Cited

U.S. PATENT DOCUMENTS

2014/0293518 A1   10/2014  Park et al.
2016/0020367 A1*  1/2016  Ling .................. H01L 33/0095
                                                                438/27

FOREIGN PATENT DOCUMENTS

| CN | 107610595 | 1/2018 |
| CN | 109036148 | 12/2018 |
| KR | 10-2014-0118482 | 10/2014 |

* cited by examiner

FLEXIBLE DISPLAY PANEL AND DISPLAY DEVICE

RELATED APPLICATIONS

This application is a National Phase of PCT Patent Application No. PCT/CN2019/103486 having International filing date of Aug. 30, 2019, which claims the benefit of priority of Chinese Patent Application No. 201910331485.5 filed on Apr. 24, 2019. The contents of the above applications are all incorporated by reference as if fully set forth herein in their entirety.

FIELD AND BACKGROUND OF THE INVENTION

The present disclosure relates to the field of liquid crystal display technology, and particularly relates to a flexible display panel and a display device.

Currently, flexible display panels are slow to return to 0 degrees after being bent to 180 degrees, while having poor support ability of a bending region. Further, during use, eyes can see a middle region floating, and when a person's hand touches, the bending region can have sag. One of known methods is to assist the flexible display panel to recover and to improve support ability by adding material that is bendable and has high recovery ability, but recovery effect and support ability are still not good.

Therefore, it is necessary to provide a new type flexible display panel and a display device to improve recovery ability and support ability of the display panel and the display device.

SUMMARY OF THE INVENTION

In order to solve the technical problems mentioned above, the present disclosure provides a flexible display panel and a display device, and through forming successive groove structures on a bending region of the display panel, and then forming an elastic layer with an undulating surface to solve the problem of poor recovery ability and poor support ability of the bending region of the display panel.

A flexible display panel of the present disclosure, including a display region and a bending region; a support layer; a substrate disposed on the support layer; a barrier layer disposed on a side of the substrate away from the support layer; a thin film transistor layer disposed on a side of the barrier layer away from the substrate; an organic light emitting layer disposed on a side of the thin film transistor layer away from the barrier layer; and an encapsulation layer disposed on the thin film transistor layer and the organic light emitting layer. In addition, in the bending region, the support layer has at least one groove, and an elastic layer is disposed in the groove.

Further, a shape of a cross section of the groove is a square shape or a triangular shape.

Further, material of the elastic layer is organic rubber or silica gel having stretchability and recovery ability.

Further, the elastic layer further includes at least one hard particle.

Further, the hard particle is a hard plastic particle.

Further, material of the substrate is polyimide.

Further, the grooves are successively disposed on the bending region.

Further, material of the barrier layer is water-oxygen proof silica.

Further, material of the support layer is a metal of stainless steel.

The present disclosure further provides a display device including the flexible display panel.

The present disclosure provides a flexible display panel and a display device, and the present disclosure makes a bending region of the flexible display panel form successive groove structures. Then, filling hard particles in the grooves, and using organic rubber or silica gel having recovery ability to wrap the grooves to form an elastic layer with an undulating surface. The elastic layer can have effect of resilient force after the flexible display panel is bent, which can improve recovery effect of the flexible display panel. Meanwhile, the hard particle performs support effect on the flexible display panel, when the flexible display panel is in a flat state.

BRIEF DESCRIPTION OF THE SEVERAL VIEWS OF THE DRAWINGS

To more clearly illustrate the technical solutions of the embodiments of the present disclosure, the accompanying figures of the present disclosure will be described in brief. Obviously, the accompanying figures described below are only part of the embodiments of the present disclosure, from which figures those skilled in the art can derive further figures without making any inventive efforts.

DESCRIPTION OF SPECIFIC EMBODIMENTS OF THE INVENTION

Figure 1:
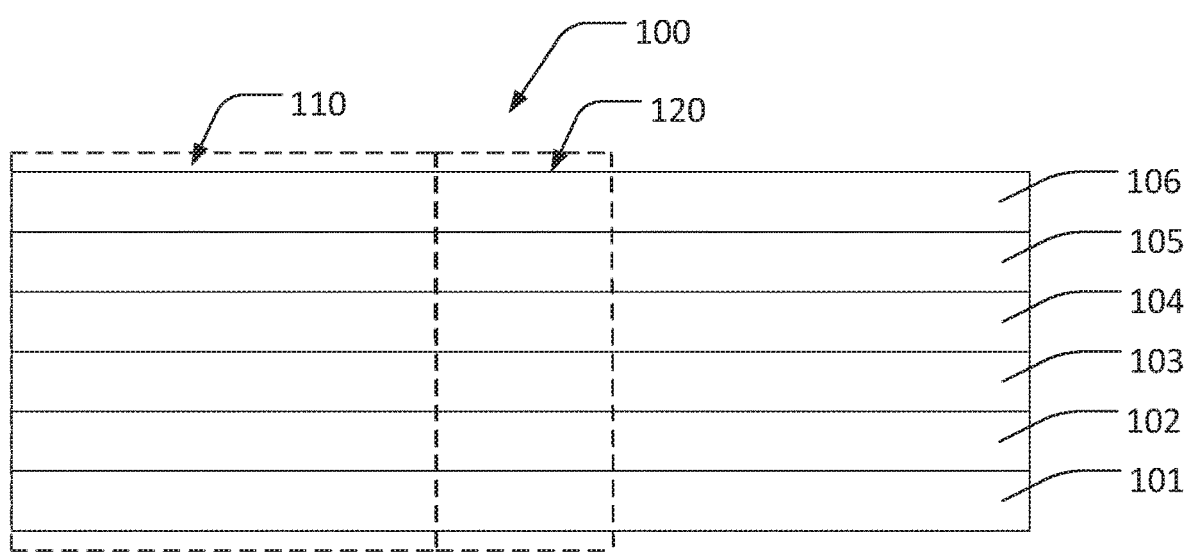
FIG. 1 is a structural schematic diagram of the display panel of the present disclosure.

The descriptions of embodiments below refer to accompanying drawings in order to illustrate certain embodiments which the present disclosure can implement. The directional terms of which the present disclosure mentions, for example, "top", "bottom", "upper", "lower", "front", "rear", "left", "right", "inside", "outside", "side", etc., are just refer to directions of the accompanying figures. The names of the elements mentioned in the present disclosure, such as "first", "second", etc., are only distinguishing between different components or elements and can be better expressed. In the figures, units with similar structures are indicated by the same reference numerals.

Embodiments of the present disclosure will be described in detail herein with reference to the accompanying figures. The present disclosure may be embodied in many different forms and the present disclosure is not to be interpreted as being limited to the specific embodiments set forth herein. The embodiments of the present disclosure are provided to explain practical application of the present disclosure, so that those skilled in the art can understand various embodiments of the present disclosure and various modifications suitable for particularly intended application.

The First Embodiment

As illustrated in FIG. 1, the first embodiment provides a flexible display panel 100, including a display region 110 and a bending region 120.

The bending region 110 is used for the flexible display panel 100 to display, and the bending region 120 can make the flexible display panel 100 to be bent. Moreover, recovery ability of the bending region 120 is good after being bent.

The flexible display panel 100 includes a support layer 101, a substrate 102, a barrier layer 103, a thin film transistor layer 104, an organic light emitting layer 105, and an encapsulation layer 106.

The support layer 101 is used for supporting bending of the entire flexible display panel 100 and for recovery after bending. Material of the support layer 101 is a metal of stainless steel.

Figure 2:
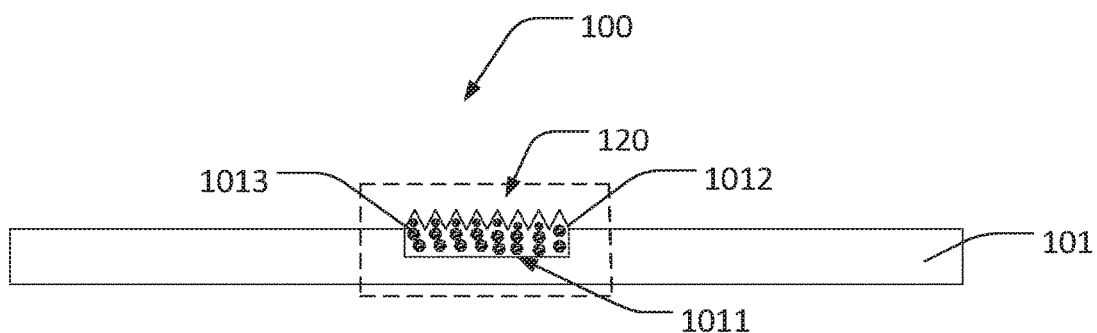
FIG. 2 is a structural schematic diagram of a support layer of the first embodiment of the present disclosure.
Figure 3:
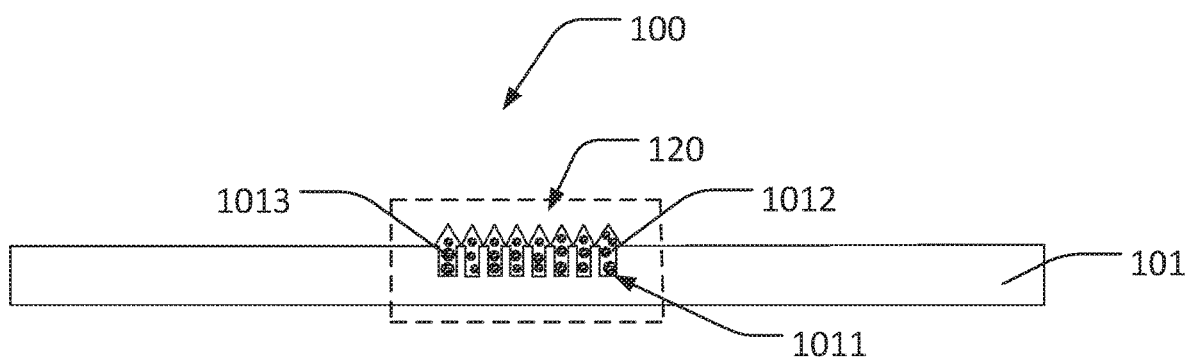
FIG. 3 is a structural schematic diagram of a support layer of the second embodiment of the present disclosure.
Figure 4:
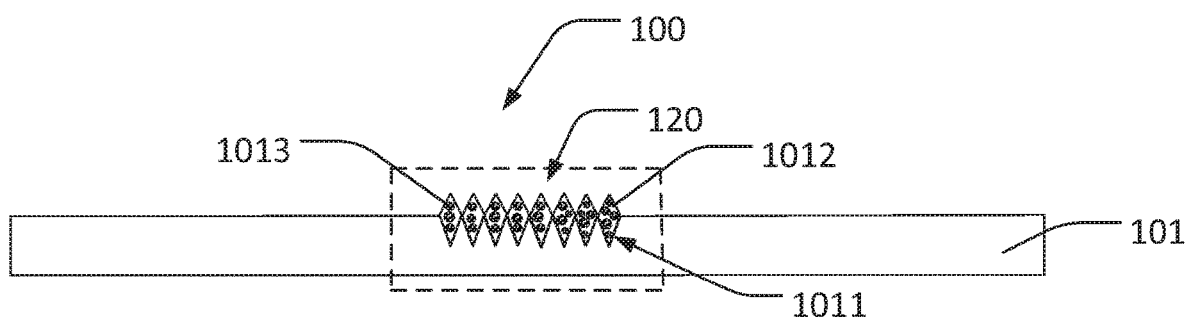
FIG. 4 is a structural schematic diagram of a support layer of the third embodiment of the present disclosure.

As illustrated in FIG. 2, in the bending region 120, the support layer 101 has at least one groove 1011, and a cross section shape of the groove 1011 is a square shape, or a triangular shape. In this embodiment, it is a square shape. The number of the groove 1011 is one.

An elastic layer 1012 is disposed in the groove 1011. Material of the elastic layer 1012 is organic rubber or silica gel having stretchability and recovery ability.

Specifically, material such as organic rubber and silica gel having stretchability and recovery ability are prepared in the groove 1011 through methods such as an injection molding method, an injection method, a method of pressing mold.

The elastic layer 1012 can have effect of resilient force after the flexible display panel 100 is bent, which can improve recovery effect of the flexible display panel 100.

A surface of the elastic layer 1012 is undulating and is a successive structure, which can increase bending stress of the bending region 120.

The elastic layer 1012 further includes at least one hard particle 1013. The hard particle 1013 is a hard plastic particle.

The hard particle 1013 performs support effect on the flexible display panel 100, when the flexible display panel 100 is in a flat state.

The hard particles 1013 can have different body shapes, and supporting forces between the hard particles 1013 with the different body shapes are different.

The substrate 102 is disposed on the support layer 101, and material of the substrate 102 is polyimide.

The barrier layer 103 is disposed on a side of the substrate 102 away from the support layer 101, and material of the barrier layer 103 is water-oxygen proof silica.

The thin film transistor layer 104 is disposed on a side of the barrier layer 103 away from the substrate 102.

The organic light emitting layer 105 is disposed on a side of the thin film transistor layer 104 away from the barrier layer 103. The organic light emitting layer 105 can be layer structures of the OLED, and specifically includes an anode, a hole injection layer, a hole transport layer, a light emitting layer, an electron transport layer, an electron injection layer, and a cathode (which is from prior art, and not shown in figures).

The anode is electrically connected to the thin film transistor layer 104 for being driven by the thin film transistor layer 104.

The hole injection layer is covered on the anode. The hole transport layer is covered on a side of the hole injection layer away from the anode. The light emitting layer is covered on a side of the hole transport layer away from the hole transport layer. The electron transport layer is covered on a side of the light emitting layer away from the hole transport layer. The electron injection layer is covered on a side of the electron transport layer away from the light emitting layer. The cathode is covered on a side of the electron injection layer away from the electron transport layer.

The organic light emitting layer 105 includes a red pixel unit, a green pixel unit, and a blue pixel unit. Generally, each of pixels of the display panel has one color unit of a red pixel unit, a green pixel unit, or a blue pixel unit. The color units between the adjacent pixels are different.

Therefore, the thin film transistor layer 104 acts a switch function to execute driving and displaying on the organic light emitting layer 105, making the organic light emitting layer 105 can emit different colors of red light, green light, or blue light.

In order to protect devices of the display panel better, and due to water and oxygen in air can make the devices of the display panel be damaged, the present disclosure protects the display panel by disposing an encapsulation layer 106.

The encapsulation layer 106 is disposed on the thin film transistor layer 104 and the organic light emitting layer 105. The thin film encapsulation layer 106 is formed from an organic layer and an inorganic layer alternately overlaid.

The encapsulation layer 106 primarily provides water-oxygen proof effect to protect the display panel well.

A display device includes the display panel. The display panel includes a display region 110 and a bending region 120.

The bending region 110 is used for the flexible display panel 100 to display, and the bending region 120 can make the flexible display panel 100 to be bent, and recovery ability of the bending region 120 is good after being bent.

In the bending region 120, the support layer 101 has at least one groove 1011, and a cross section shape of the groove 1011 is a square shape, a tooth shape, or a triangular shape. In this embodiment, it is a square shape. The number of the groove 1011 is one.

An elastic layer 1012 is disposed in the groove 1011. Material of the elastic layer 1012 is organic rubber or silica gel having stretchability and recovery ability. Specifically, material such as organic rubber and silica gel having stretchability and recovery ability are prepared in the groove 1011 through methods such as an injection molding method, an injection method, a method of pressing mold. The elastic layer 1012 can have effect of resilient force after the flexible display panel 100 is bent, which can improve recovery effect of the flexible display panel 100. A surface of the elastic layer 1012 is undulating, and is a successive structure, which can increase bending stress of the bending region 120.

The elastic layer 1012 further includes at least one hard particle 1013. The hard particle 1013 is a hard plastic particle. The hard particle 1013 performs support effect on the flexible display panel 100, when the flexible display panel 100 is in a flat state. The hard particle 1013 can have different body shapes, and supporting forces between the hard particles 1013 with the different body shapes are different.

The Second Embodiment

The present disclosure further provides the second embodiment, most implement solutions of the second embodiment is same as the first embodiment. The difference is that the second embodiment has a plurality of grooves 1011, and the grooves 1011 are successively disposed on the bending region 120.

The second embodiment further increases stress of the bending region 120 of the support layer 101 by disposing a plurality of square grooves 1011. Then, filling hard particles 1013 in the grooves 1011, using organic rubber or silica gel having recovery ability to fill the grooves 1011, and wrapping the hard particles 1013 to form an elastic layer 1012 with an undulating surface.

The Third Embodiment

The present disclosure further provides the third embodiment, most implement solutions of the third embodiment is same as the second embodiment.

The difference is that the shape of the grooves 1011 of the second embodiment is a triangular shape, and the grooves 1011 are successively disposed on the bending region 120.

By disposing a plurality of triangular grooves 1011 in the third embodiment, the stress of the bending region 120 of the third embodiment is larger than that of the square structure of the second embodiment. Then, filling hard particles 1013 in the groove 1011, using organic rubber or silica gel having recovery ability to fill the grooves 1011, and wrapping the hard particles 1013 to form an elastic layer 1012 with an undulating surface. The elastic layer 1012 can have effect of resilient force after the flexible display panel 100 is bent, which can improve recovery effect of the flexible display panel 100. The third embodiment is the most preferred embodiment of the present disclosure.

The technical scope of the present disclosure is not limited to the above description, and those skilled in the art can make various modifications and changes to the above embodiments without departing from the technical idea of the present disclosure, and this modifications and changes are all within the scope of the present disclosure.

What is claimed is:
1. A flexible display panel comprising: a display region and a bending region;
   a support layer;
   a substrate disposed on the support layer;
   a barrier layer disposed on a side of the substrate away from the support layer;
   a thin film transistor layer disposed on a side of the barrier layer away from the substrate;
   an organic light emitting layer disposed on a side of the thin film transistor layer away from the barrier layer; and
   an encapsulation layer disposed on the thin film transistor layer and the organic light emitting layer;
   wherein, in the bending region, the support layer has at least one groove; and an elastic layer is disposed in the groove.
2. The flexible display panel as claimed in claim 1, wherein a shape of a cross section of the groove is a square shape or a triangular shape.
3. The flexible display panel as claimed in claim 1, wherein material of the elastic layer is organic rubber or silica gel having stretchability and recovery ability.
4. The flexible display panel as claimed in claim 2, wherein the elastic layer further includes at least one hard particle.
5. The flexible display panel as claimed in claim 4, wherein the hard particle is a hard plastic particle.
6. The flexible display panel as claimed in claim 1, wherein material of the substrate is polyimide.
7. The flexible display panel as claimed in claim 1, wherein the grooves are successively disposed on the bending region.
8. The flexible display panel as claimed in claim 1, wherein material of the barrier layer is water-oxygen proof silica.
9. The flexible display panel as claimed in claim 1, wherein material of the support layer is a metal of stainless steel.
10. A display device comprising the display panel as claimed in claim 1.
11. The display device as claimed in claim 10, wherein a shape of a cross section of the groove is a square shape or a triangular shape.
12. The display device as claimed in claim 10, wherein material of the elastic layer is organic rubber or silica gel having stretchability and recovery ability.
13. The display device as claimed in claim 10, wherein the elastic layer further comprises at least one hard particle.

\* \* \* \* \*